(12) United States Patent
Nakamura et al.

(10) Patent No.: US 7,301,834 B2
(45) Date of Patent: Nov. 27, 2007

(54) SEMICONDUCTOR MEMORY

(75) Inventors: Hiroshi Nakamura, Fujisawa (JP);
Toshio Yamamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 10/694,861

(22) Filed: Oct. 29, 2003

(65) Prior Publication Data
US 2004/0136245 A1 Jul. 15, 2004

(30) Foreign Application Priority Data
Oct. 30, 2002 (JP) .............................. 2002-316720

(51) Int. Cl.
*G11C 7/00* (2006.01)
(52) U.S. Cl. ............ 365/201; 365/185.33; 365/185.29; 365/185.12
(58) Field of Classification Search ................ 365/201, 365/185.33, 185.29, 185.12
See application file for complete search history.

(56) References Cited

U.S. PATENT DOCUMENTS 5,034,928 A * 7/1991 Isobe .................... 365/230.03
6,031,760 A * 2/2000 Sakui et al. ............ 365/185.21
2003/0214853 A1* 11/2003 Hosono et al. ............. 365/200
2004/0145952 A1* 7/2004 Chen et al. ............ 365/185.33

FOREIGN PATENT DOCUMENTS

| JP | 7-281952 | 10/1995 |
| JP | 9-82923 | 3/1997 |
| JP | 11-224492 | 8/1999 |
| JP | 2001-155500 | 6/2001 |
| JP | 2001-167586 | 6/2001 |

* cited by examiner

*Primary Examiner*—Son Dinh
*Assistant Examiner*—N Nguyen
(74) *Attorney, Agent, or Firm*—Oblon, Spivak, McClelland, Maier & Neustadt, P.C.

(57) ABSTRACT

A plurality of memory cell arrays Array0, Array1, Array2, Array3, Array4, Array5, Array6 and Array7 which can perform a parallel operation are arranged in a later generation chip. Each of the memory cell arrays Array0 and Array4, the memory cell arrays Array1 and Array5, the memory cell arrays Array2 and Array6, and the memory cell arrays Array3 and Array7 constitutes one cell array group. A Pass/Fail signal indicative of success or failure of the operation is outputted in accordance with each cell array group. It is good to make the number of cell array groups equal to the number of memory cell arrays or the number of cell array groups of a precedent generation chip.

21 Claims, 12 Drawing Sheets

SEMICONDUCTOR MEMORY

CROSS-REFERENCE TO RELATED APPLICATIONS

This application is based upon and claims the benefit of priority from the prior Japanese Patent Application No. 2002-316720, filed Oct. 30, 2002, the entire contents of which are incorporated herein by reference.

BACKGROUND OF THE INVENTION

1. Field of the Invention

The present invention relates to a non-volatile semiconductor memory having a plurality of memory cell arrays which can perform a parallel operation in particular.

2. Description of the Related Art

There has been conventionally known an EEPROM in which information can be electrically reprogrammed as one of semiconductor memories. Among others, an NAND cell type EEPROM in which an NAND cell block is constituted by connecting a plurality of memory cells in series attracts attention as a memory which can be highly integrated (see, e.g., Japanese patent application laid-open No. 9-82923).

One memory cell of the NAND cell type EEPROM has an FET-MOS structure in which a floating gate (charge storage layer) and a control gate are laminated on a semiconductor substrate through an insulating film. Further, an NAND cell is constituted by connecting a plurality of memory cells in series in such a manner that a source and a drain are shared by adjacent memory cells, and this structure as one unit is connected to a bit line.

A memory cell array is constituted by arranging such NAND cells in a matrix form. The memory cell array is integrated and formed in a p type substrate or a p type well.

Drains of the NAND cells aligned in a column direction of the memory cell array on one end side are respectively connected to a bit line in common through a selection gate transistor, and sources on the other end side are respectively connected to a common source line through a selection gate transistor. A control gate of the memory transistor and a gate electrode of the selection gate transistor are connected in common in a row direction of the memory cell array as a control gate line (word line) and a selection gate line, respectively.

An operation of this NAND cell type EEPROM is as follows.

A data program operation is mainly performed from a memory cell provided at a position farthest from a bit line contact in sequence.

First, when the data program operation is started, 0V ("1"—data program bit line) or a power supply voltage Vcc ("0"—data program bit line) is given to the bit line in accordance with program data, and Vcc is supplied to the selection gate line on the bit line contact side. In this case, in a selected NAND cell connected to the "1"—data program bit line, a channel portion in the NAND cell is fixed to 0V through the selection gate transistor.

On the other hand, in the selected NAND cell connected to "1"—data program bit line, a channel portion in the NAND cell is charged to [Vcc−Vtsg (Vtsg is a threshold voltage of the selection gate transistor)] through the selection gate transistor and then enters a floating state. Subsequently, a control gate line of a selected memory cell in the selected NAND cell reaches 0V→Vpp (=approximately 20V: program high voltage), and any other control gate line in the selected NAND cell reaches 0V→Vmg (=approximately 10V: intermediate voltage).

In the selected NAND cell connected to the "1"—data program bit line, since the channel portion in the NAND is fixed to 0V, a large potential difference (=approximately 20V) is generated between the gate (=Vpp potential) and the channel portion (=0V) in the selected memory cell in the selected NAND cell, and electron injection occurs from the channel portion. As a result, a threshold value of the selected memory cell shifts in a forward direction, and programming of 1"—data is completed.

In the selected NAND cell connected to the "0"—data program bit line, a channel portion in the NAND is in a floating state. Therefore, a channel portion potential is increased from a [Vcc−Vtsg] potential to Vmch (=approximately 8V) while maintaining the floating state with an increase in a control gate line voltage (0V→Vpp, Vmg) due to an influence of capacitance coupling between the control gate line and the channel portion in the selected NAND gate. At this time, since a potential difference between the gate (=Vpp potential) and the channel portion of the selected memory cell in the selected NAND is relatively as small as approximately 12V, electron injection does not occur. Therefore, a threshold value of the selected memory cell does not vary and it is maintained in a negative state.

Data erasing is performed with respect to all the memory cells in the selected NAND cell block at the same time. That is, all the control gates in the selected NAND cell block are determined to have 0V, and a high voltage which is approximately 20V is applied to the bit line, the source line, the p type well (or the p type substrate), and the control gates and all the selected gates in a non-selected NAND cell block. As a result, electrons of the floating gates in all the memory cells in the selected NAND cell block are discharged to the p type well (or the p type substrate), and the threshold voltage is shifted in a negative direction.

A data read operation is carried out by detecting whether a current flows through a selected memory cell provided that the control gates of the selected memory cell are determined to have 0V and the control gates and the selected gate of any other memory cells are determined to have a read intermediate voltage Vread ($\leq$4V).

Such an NAND cell type EEPROM usually has a function to output a Pass/Fail signal indicative of whether an operation such as programming or erasing has attained success or failed after completion of this operation. That is, for example, after a program/erase operation is terminated, when a command to output the Pass/Fail signal to the outside of a chip is inputted, the Pass/Fail signal is outputted from an I/O pad.

Further, as shown in FIG. 1, the NAND type EEPROM in recent years has a plurality of memory cell arrays Array0, Array1, Array2 and Array3 in one chip, and is constituted in such a manner that the plurality of memory cell arrays Array0, Array1, Array2 and Array 3 are operated in parallel in order to realize a high-speed operation.

In this case, to the NAND type EEPROM is added a function to output the Pass/Fail signal indicative of whether, e.g., a program/erase operation has attained success with respect to all the memory cell arrays after the program/delete operation is terminated or whether the program/erase operation has failed with respect to at least one memory cell array, i.e., the Pass/Fail signal of the entire chip. Furthermore, there is added a function to output a plurality of Pass/Fail signals indicative of whether the program/erase operation has attained success or failed with respect to each of the plurality of memory cell arrays, i.e., a Pass/Fail signal for each memory cell array.

Table 1 shows an example of allocation of the Pass/Fail signal to data input/output terminals I/O 0 to I/O 7 in the non-volatile semiconductor memory depicted in FIG. 1.

TABLE 1

(a) com-A

| | STATUS | OUTPUT |
|---|---|---|
| I/O0 | Chip Status-I | Pass → 0 Fail → 1 |
| I/O1 | Not Used | 0 |
| I/O2 | Not Used | 0 |
| I/O3 | Not Used | 0 |
| I/O4 | Not Used | 0 |
| I/O5 | Not Used | 0 |
| I/O6 | Ready/Busy | Busy → 0 Ready → 1 |
| I/O7 | Write Protect | Protect → 0 Not Protect → 1 |

TABLE 2

(b) com-B

| | STATUS | OUTPUT |
|---|---|---|
| I/O0 | Chip Status-I | Pass → 0 Fail → 1 |
| I/O1 | Array (0) | Pass → 0 Fail → 1 |
| I/O2 | Array (1) | Pass → 0 Fail → 1 |
| I/O3 | Array (2) | Pass → 0 Fail → 1 |
| I/O4 | Array (3) | Pass → 0 Fail → 1 |
| I/O5 | Not Used | 0 |
| I/O6 | Ready/Busy | Busy → 0 Ready → 1 |
| I/O7 | Write Protect | Protect → 0 Not Protect → 1 |

As apparent from Table 1 and Table 2, the non-volatile semiconductor memory usually has a function (Table 1) to output the Pass/Fail signal of the entire chip as well as a function (Table 2) to output the Pass/Fail signal for each memory cell array.

Moreover, in order to realize, e.g., the function of Table 1, supplying a command com-A to the chip can suffice. Additionally, in order to realize the function of Table 2, supplying a command com-B to the chip can suffice.

Meanwhile, as shown in FIG. 1, when one chip is enough for a memory capacity required for a package product (package product=1 gigabit, memory chip capacity=1 gigabit), only one chip is usually put in the package product. However, as shown in FIG. 2, when one chip is not enough for a memory capacity required for a package product (package product=2 gigabit, memory chip capacity=1 gigabit), a plurality of chips, which is two chips in this example, must be put in the package product.

Further, allocation of the Pass/Fail signal to the data input/output terminals I/O 0 to I/O 7 in the non-volatile semiconductor memory depicted in FIG. 2 is as shown in Table 1 and Table 2 like the semiconductor memory illustrated in FIG. 1.

That is, two chips are selected based on chip addresses. Furthermore, an output operation of the Pass/Fail signal is executed with respect to the selected chip under statuses based on Table 1 or Table 2.

When chips used in the package products shown in FIGS. 1 and 2 are determined as the first generation, the second generation chips usually have a memory capacity which is twofold or above of the memory capacity of the first generation due to a reduction in design rule or the like. Therefore, for example, when the second generation chip is used in the package product shown in FIG. 2, putting only one chip in the package product can suffice, thereby reducing a chip cost.

However, the conventional non-volatile semiconductor memory has two types of output mode of the Pass/Fail signal, i.e., an output mode of the Pass/Fail signal of the entire chip and an output mode of the Pass/Fail signal for each memory cell array. This is the same even though the generation of the memory chip advances. On the other hand, when the generation of the memory chip advances one step, the number of memory cell arrays which are arranged in one chip and can perform a parallel operation doubles or more.

Therefore, for example, in output of the Pass/Fail signal for each memory cell array with respect to the second generation chip, allocation of the Pass/Fail signal for the first generation chip such as shown in Table 2 to the data input/output terminals I/O 0 to I/O 7 cannot be used as it is.

Therefore, since a system which outputs the Pass/Fail signal in the second generation chip is different from the counterpart in the first generation chip, the memory chip cannot be simply replaced from the first generation to the second generation with respect to the same package product.

As described above, replacing the chip used in the same package product from the first generation to the second generation is very effective in order to reduce a chip cost in the prior art. However, since there is no compatibility between the system which outputs the Pass/Fail signal in the first generation chip and the system which outputs the Pass/Fail signal in the second generation chip, there is a problem that replacing the chip used in the same package product from the first generation to the second generation is difficult.

Therefore, in regard to the system which outputs the Pass/Fail signal, there have been demanded a facilitation of replacement from the precedent generation chip to the next generation chip with respect to the same package product and a reduction in a chip cost by giving the compatibility between the precedent generation chip and the next generation chip.

BRIEF SUMMARY OF THE INVENTION

A semiconductor memory according to an example of the present invention comprises a plurality of memory cell arrays constituted of a plurality of memory cell units arranged in a matrix, the plurality of memory cell arrays constitute a plurality of cell array groups each of which consists of two or more memory cell arrays and output a first Pass/Fail signal indicative of success or failure of an operation for each cell array group.

DETAILED DESCRIPTION OF THE INVENTION

A semiconductor memory according to an example of the present invention will now be described in detail hereinafter with reference to the accompanying drawings.

(1) Outline

Figure 3:
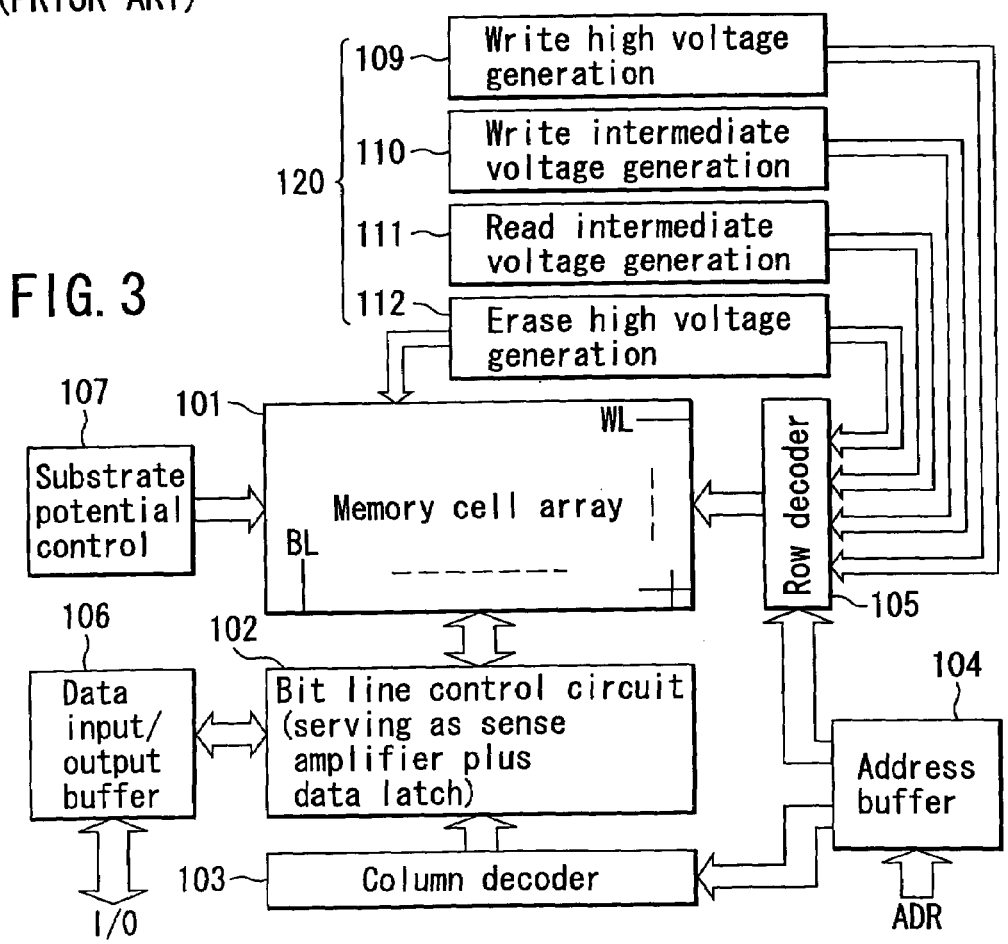
FIG. 3 is a block diagram showing a primary part of an EEPROM according to an example of the present invention.

FIG. 3 shows a primary part of an NAND cell type EEPROM according to an example of the present invention.

A bit line control circuit 102 is provided to a memory cell array 101 in order to perform programming, reading, reprogramming and verify-reading of data. This bit line control circuit 102 is connected to a data input/output buffer 106 and accepts as an input an output from a column decoder 103 which receives an address signal from an address buffer 104.

Further, a row decoder 105 is provided to the memory cell array 101 in order to control a control gate and a selected gate. A substrate potential control circuit 107 controls a potential of a p type substrate (or a p type well) to which the memory cell array 101 is formed. Furthermore, in a data program operation, a program high voltage generation circuit 109 generates a program high voltage Vpp ($\leq 20V$), and a program intermediate voltage generation circuit 110 generates an intermediate voltage Vmg ($\leq 10V$).

A read intermediate voltage generation circuit 111 generates a read intermediate voltage Vread when reading data. Furthermore, an erase high voltage generation circuit 112 generates an erase high voltage Vpp ($\leq 20V$) in an erase operation.

The bit light control circuit 102 mainly consists of a CMOS flip-flop, and performs latching of data for the program operation, a sense operation to read a potential of the bit line, a sense operation to verify-read data after the program operation, and latching of reprogrammed data.

Figure 4A:
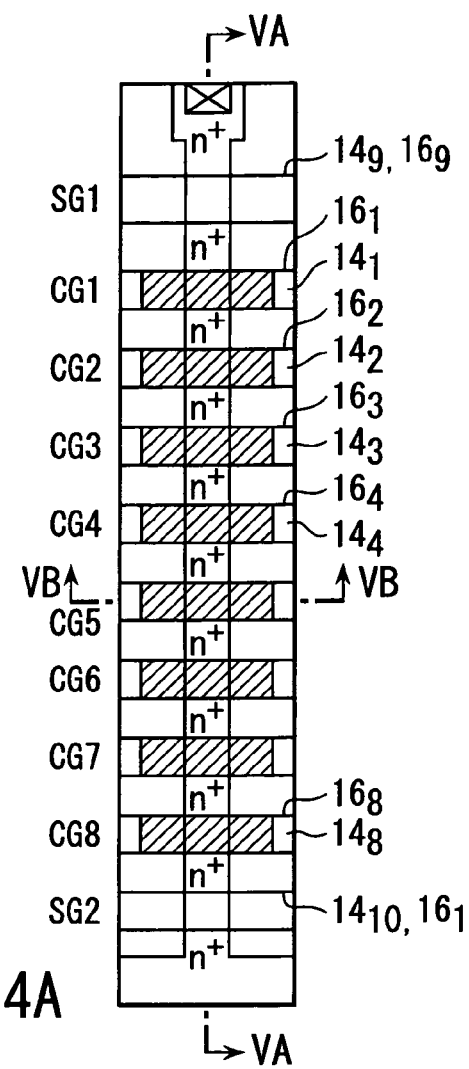
FIGS. 4A and 4B are views showing an example of an NAND cell.
Figure 4B:
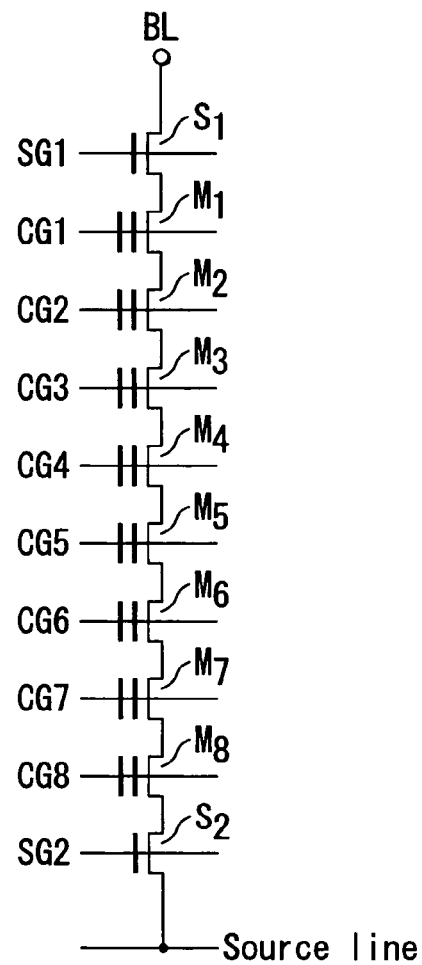
Figure 5A:
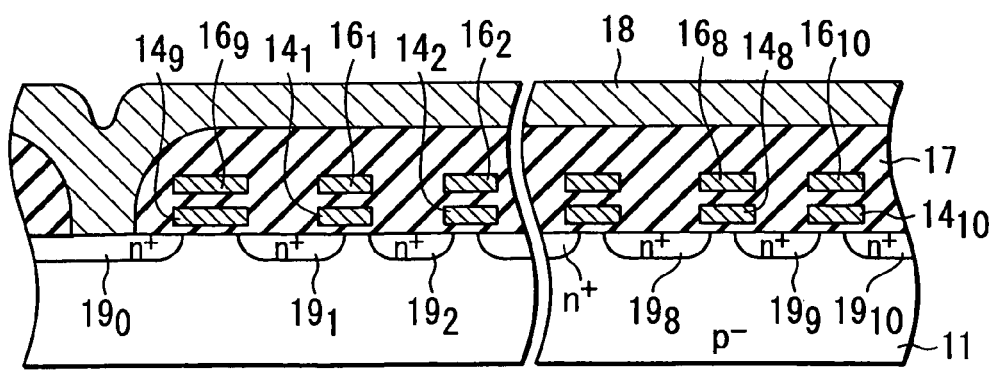
FIGS. 5A and 5B are cross-sectional views showing a structural example of the NAND cell.
Figure 5B:
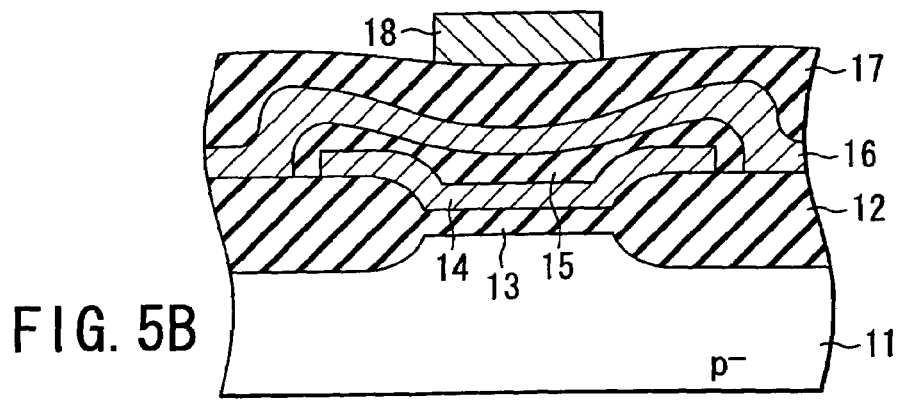

FIGS. 4A and 4B are a plane view and an equivalent circuit diagram showing one NAND cell part of the memory cell array, FIG. 5A is a cross-sectional view taken along the line VA-VA in FIG. 4A, and FIG. 5B is a cross-sectional view taken along the line VB-VB in FIG. 4A.

A memory cell array consisting of a plurality of NAND cells is formed on a p type silicon substrate (or a p type well) 11 surrounded by an element separation oxide film 12. Paying attention to one NAND cell, eight memory cells M1 to M8 are connected in series in order to constitute one NAND cell in this example.

Each memory cell is formed on the silicon substrate 11. The memory cell is constituted of a floating gate electrode ($14_1, 14_2, \ldots 14_8$) on a gate insulating film 13 and a control gate electrode 16 ($16_1, 16_2, \ldots 16_8$) on an interlayer insulating film 15. The control gate electrode 16 ($16_1, 16_2, \ldots 16_8$) functions as a word line.

An n type diffusion layer ($19_0, 19_1, \ldots 19_{10}$) becomes a source/drain of the memory cell. The n type diffusion layer ($19_0, 19_1, \ldots 19_{10}$) is shared by the memory cells adjacent to each other, and the plurality of memory cells are thereby connected in series, thus constituting the NAND cell.

Selection gate electrodes $14_9, 16_9, 14_{10}$ and $16_{10}$ are respectively formed on a drain side and a source side of the NAND cell. The selection gate electrodes $14_9, 16_9, 14_{10}$ and $16_{10}$ are formed simultaneously with floating gate electrodes 14 ($14_1, 14_2, \ldots 14_8$) and the control gate electrodes 16 ($16_1, 16_2, \ldots 16_8$).

The memory cells and a selection transistor are covered with a CVD oxide film 17. A bit line 18 is arranged on the CVD oxide film 17 and connected to one end of the NAND cell, i.e., the drain side diffusion layer 19.

The control gate electrodes 16 ($16_1, 16_2, \ldots 16_8$) become control gate lines CG1, CG2, ... CG8, and the selection gate electrodes $14_9, 16_9, 14_{10}$ and $16_{10}$ become selection gate lines SG1 and SG2.

Figure 6:
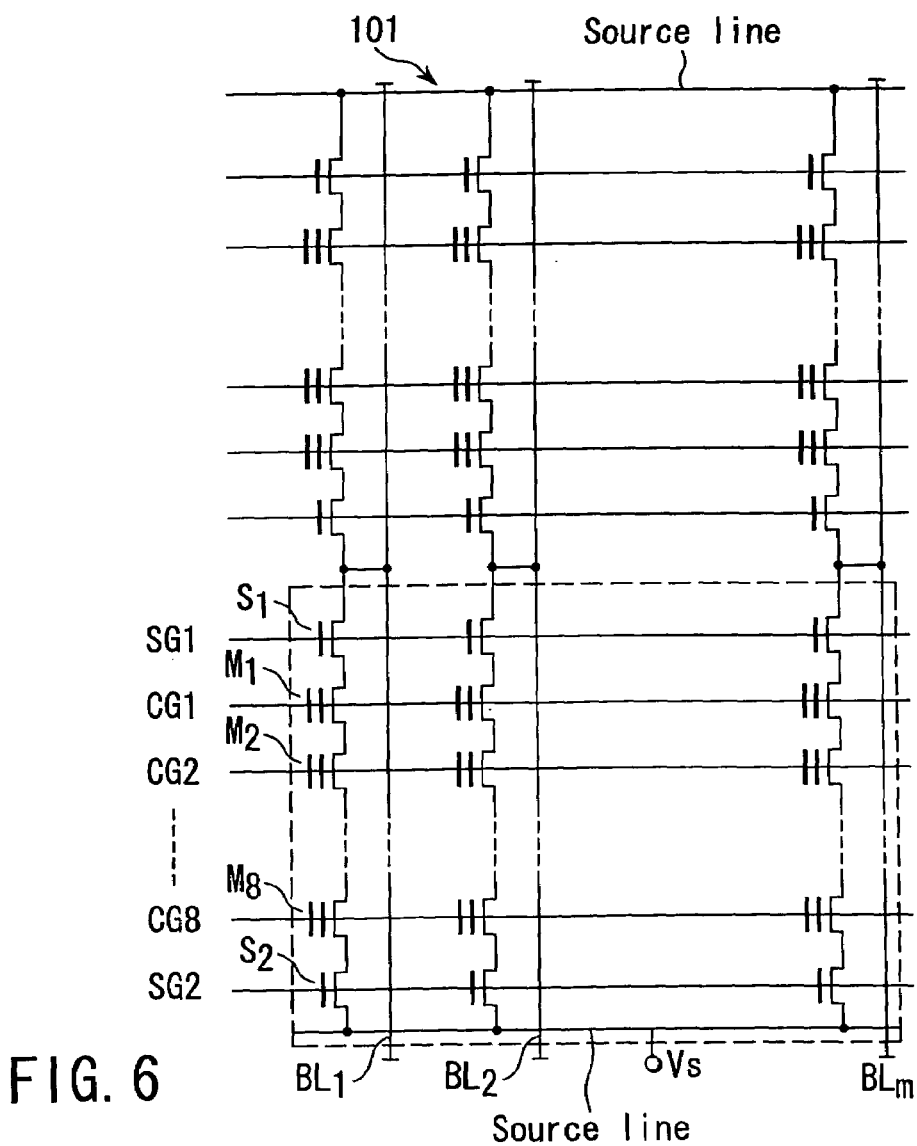
FIG. 6 is a circuit diagram showing a circuit example of an NAND cell array.

FIG. 6 shows an equivalent circuit of the memory cell array constituted of the NAND cells arranged in a matrix.

A plurality of NAND cell units arranged in a direction that the control gate lines CG1, CG2, ... CG8 and the selection gate lines SG1 and SG2 extend constitute one group. Specifically, an area surrounded by a broken line in FIG. 6 forms one group. In a usual read/program operation, only one in a plurality of groups is selected. The selected group is a selection group.

Figure 7:
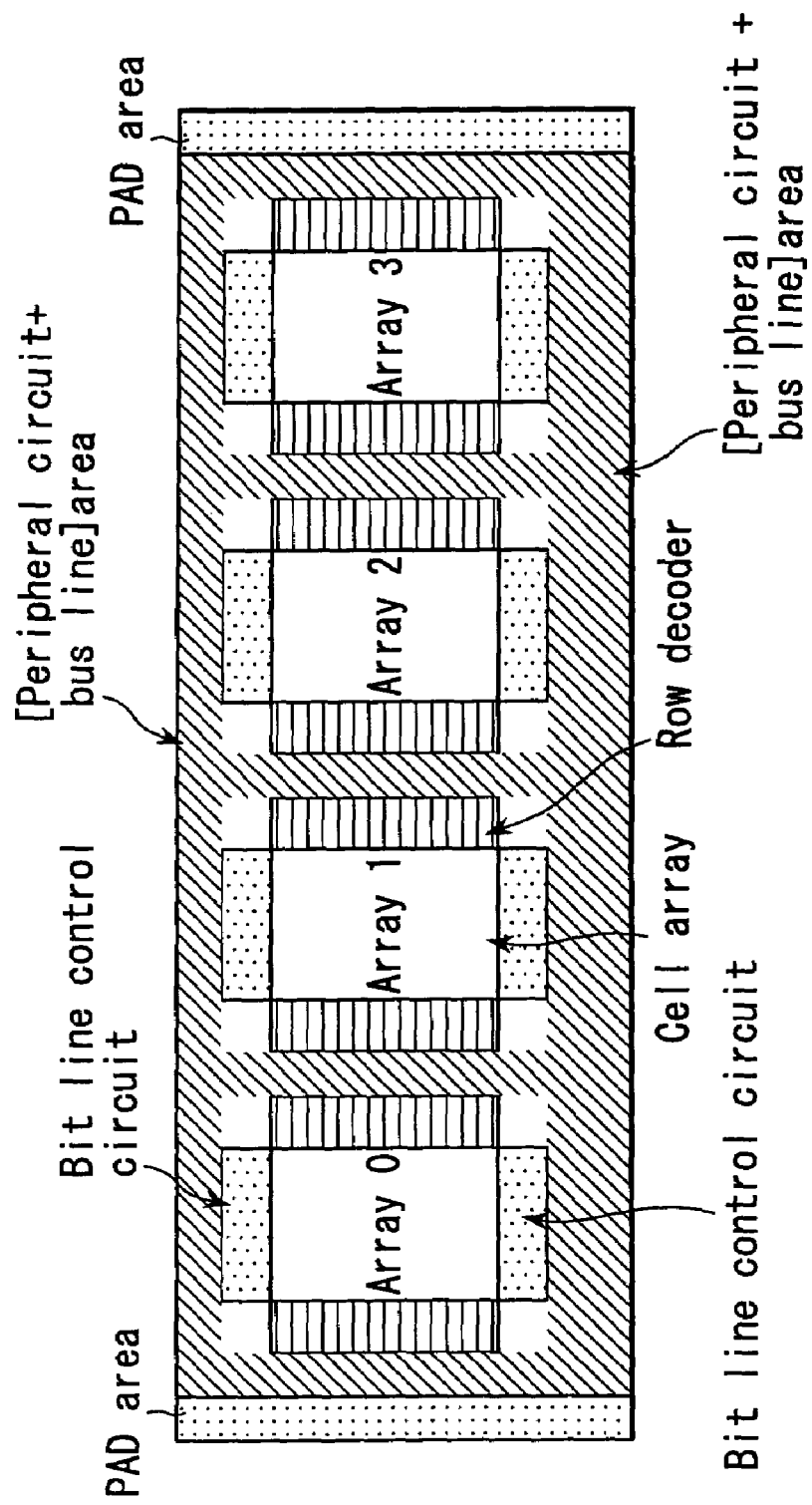
FIG. 7 is a view showing an example of a chip layout of an NAND cell type EEPROM.

FIG. 7 shows an example of a chip structure of the NAND cell type EEPROM.

The chip of the NAND cell type EEPROM includes a memory cell array, a bit line control circuit, a row decoder circuit, a pad area and a [peripheral circuit+bus line] area.

As described above, the chip structure of the NAND cell type EEPROM is constituted of a plurality of elements, but only a chip outer shape and a cell array are given in the following description (FIG. 8 and subsequent drawings) for simplicity.

(1) EMBODIMENT1

Replacement of Chip for Two Gigabit Package Product

A consideration will be given as to a case that a memory capacity required for a package product is two gigabits.

Figure 1:
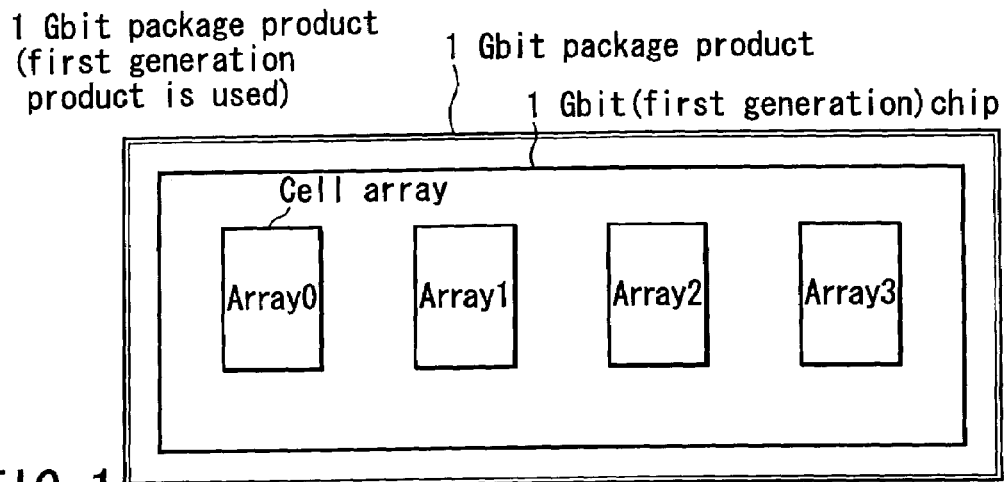
FIG. 1 is a view showing a package product having one first generation chip mounted thereon.

As shown in FIG. 1, a first generation EEPROM chip has, e.g., four memory cell arrays Array0, Array1, Array2 and Array3, and a memory capacity of the entire chip is one gigabit.

Figure 2:
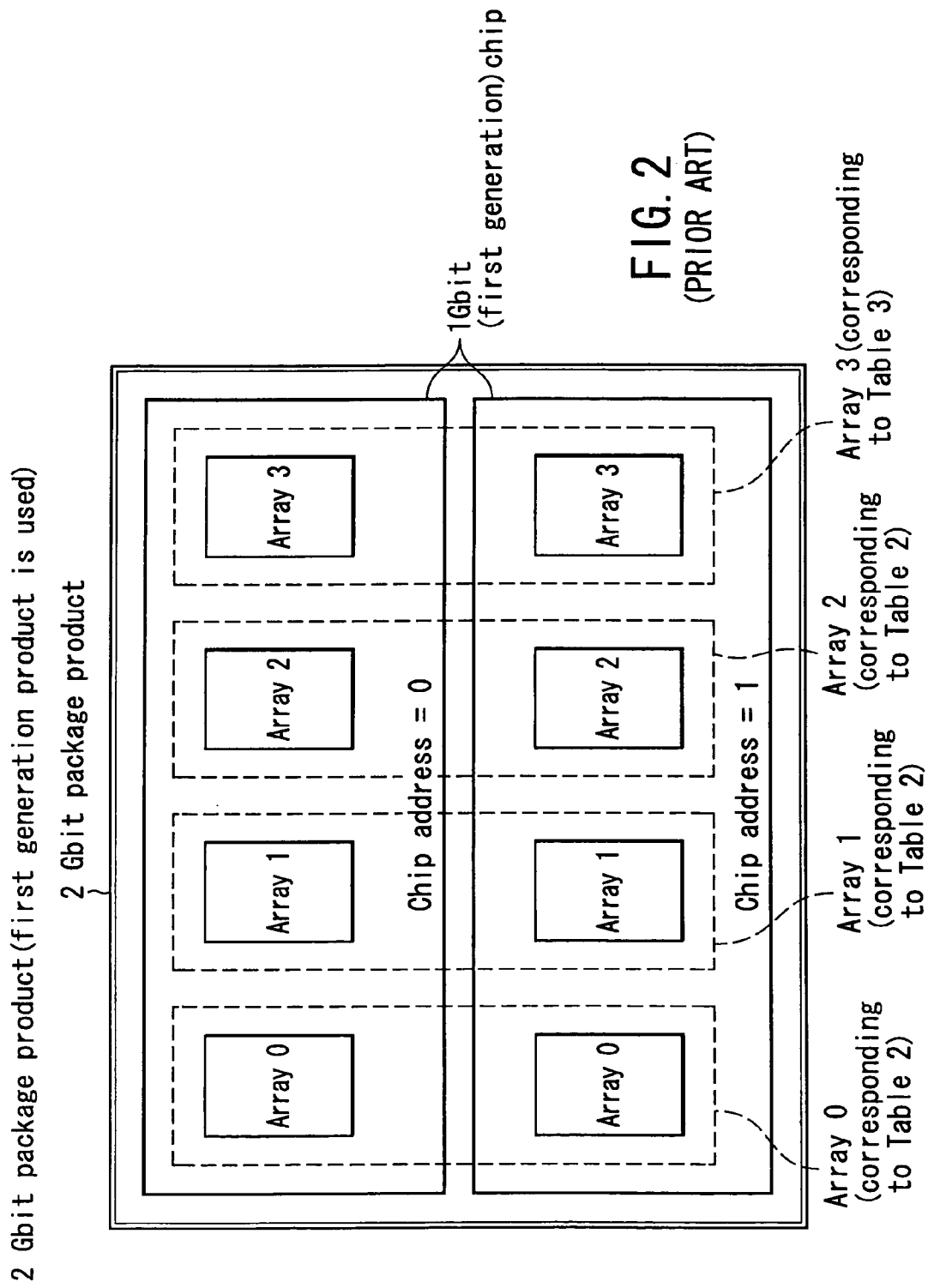
FIG. 2 is a view showing a package product having two first generation chips mounted thereon.

In this case, as shown in FIG. 1, when the memory capacity required for the package product is one gigabit, putting one EEPROM chip in the package product can suffice. In this example, however, since the memory capacity required for the package product is two gigabits, two EEPROM chips must be put in the package product as shown in FIG. 2.

The two EEPROM chips are selected based on chip addresses. In the selected EEPROM chips, when a command com-A is supplied to the chip, a Pass/Fail signal of the entire chip is outputted in accordance with allocation of the Pass/Fail signal to data input/output terminals I/O 0 to I/O 7 shown in Table 1. Further, when a command com-B is supplied to the chip, the Pass/Fail signal for each memory cell array is outputted in accordance with allocation of the Pass/Fail signal to the data input/output terminals I/O 0 to I/O 7 shown in Table 2.

Meanwhile, in the second generation (generation using a second design rule smaller than a first design rule) after the first generation (generation using the first design rule), the memory capacity of one EEPROM chip is larger than the memory capacity of the first generation EEPROM chip.

Figure 9:
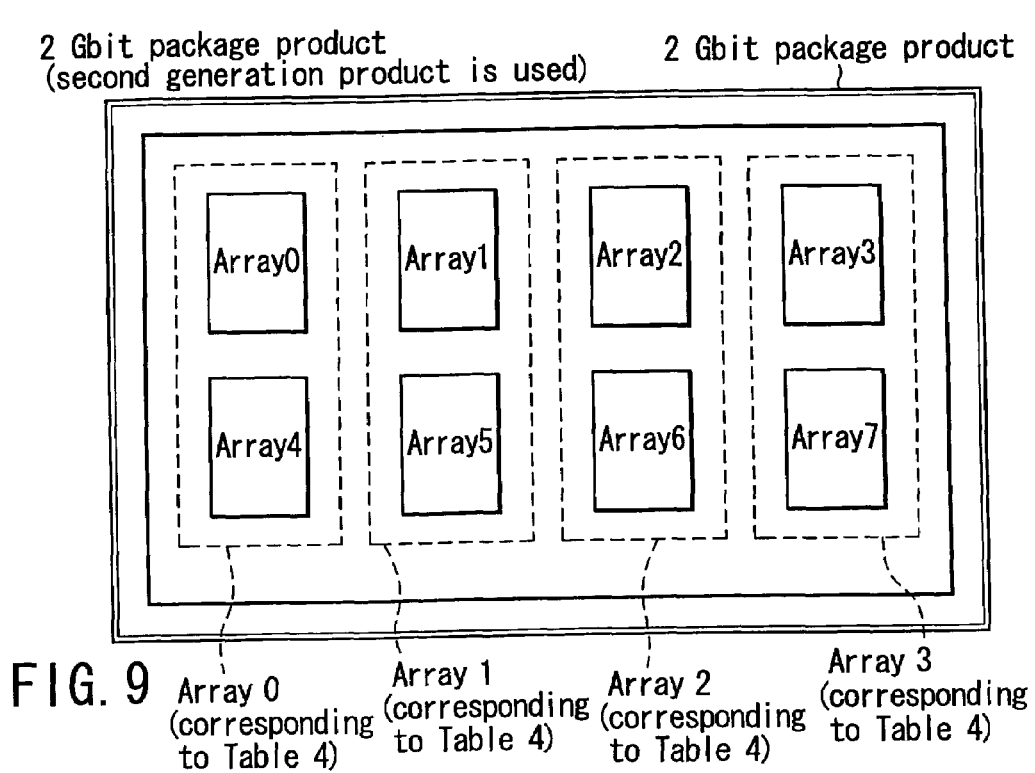
FIG. 9 is a view showing a package product having one second generation chip mounted thereon.

For example, when a maximum memory capacity of the first generation EEPROM chip is one gigabit, a maximum memory capacity of the second generation EEPROM chip is two gigabits. In this case, as shown in FIG. 9, the two first generation EEPROM chips can be substituted by one second generation EEPROM chip for the two-gigabit package product.

Usually, a chip cost per fixed memory capacity (e.g., one bit) of the second generation chip is smaller than that of the first generation chip, and hence a reduction in cost of the package product can be realized by this substitution.

However, a point to notice when replacing the first generation chip with the second generation chip is the compatibility of the system.

The NAND cell type EEPROM usually includes a function to output a Pass/Fail status of the chip, and can output a Pass/Fail signal indicative of whether, e.g., a program/erase operation has attained success or failed after this operation. The Pass/Fail signal is outputted from the I/O pad after a Pass/Fail output command is inputted to the chip.

That is, as a flow when outputting the Pass/Fail signal, ① a Pass/Fail output command is first inputted, and ② the Pass/Fail signal is then outputted.

Table 3 and Table 4 show examples of allocation of the Pass/Fail signal to the data input/output terminals I/O 0 to I/O 7 in the second generation EEPROM chip depicted in FIG. 9.

TABLE 3

(a) com-A

| | STATUS | OUTPUT |
|---|---|---|
| I/O0 | Chip Status-I | Pass → 0 Fail → 1 |
| I/O1 | Not Used | 0 |
| I/O2 | Not Used | 0 |
| I/O3 | Not Used | 0 |
| I/O4 | Not Used | 0 |
| I/O5 | Not Used | 0 |
| I/O6 | Ready/Busy | Busy → 0 Ready → 1 |
| I/O7 | Write Protect | Protect → 0 Not Protect → 1 |

TABLE 4

(b) com-B

| | STATUS | OUTPUT |
|---|---|---|
| I/O0 | Chip Status-I | Pass → 0 Fail → 1 |
| I/O1 | Array (0) or Array (4) Status | Pass → 0 Fail → 1 |
| I/O2 | Array (1) or Array (5) Status | Pass → 0 Fail → 1 |
| I/O3 | Array (2) or Array (6) Status | Pass → 0 Fail → 1 |
| I/O4 | Array (3) or Array (7) Status | Pass → 0 Fail → 1 |
| I/O5 | Not Used | 0 |
| I/O6 | Ready/Busy | Busy → 0 Ready → 1 |
| I/O7 | Write Protect | Protect → 0 Not Protect → 1 |

In the examples of Table 3 and Table 4, eight data input/output terminals I/O 0 to I/O 7 are used, and data outputted from the data input/output terminals I/O 0 to I/O 7 is up to eight bits. This facilitates understanding of replacement of the chips in the present invention, and is associated with the first generation EEPROM chip (Table 1 and Table 2).

Although the following will describe as to an example that the eight data input/output terminals I/O 0 to I/O 7 are used (eight-bit output), the present invention is not restricted thereto, and it can be applied to a case of, e.g., a one-bit output, a two-bit output, a four-bit output, a 16-bit output, a 32-bit output and the like.

Table 3 shows statuses when the Pass/Fail signal of the entire chip is outputted. In this case, com-A is supplied to the chip as a Pass/Fail output command.

In the operation to output the Pass/Fail signal of the entire chip, a Pass signal (="0") is outputted when a predetermined operation has attained success with respect to all the memory cell arrays in the chip, and a Fail signal (="1") is outputted when a predetermined operation has failed with respect to at least one memory cell array in the chip. The Pass/Fail signal of the entire chip is outputted from the data input/output terminal I/O 0.

For example, in case of the EEPROM chip shown in FIG. 9, the Pass/Fail signal of the entire chip can be obtained by taking a logical sum (OR) of the Pass/Fail signals respectively outputted from the eight memory cell arrays Array0, Array1, Array3, Array4, Array5, Array6 and Array7 (when Pass="0", Fail="1").

Statuses of the data input/output terminals I/O 0 to I/O 7 in Table 3 match with statuses of the data input/output terminals I/O 0 to I/O 7 in Table 1. For example, in any case, the Pass/Fail signal of the entire chip is outputted from the data input/output terminal I/O 0.

Therefore, in regard to providing the function to output the Pass/Fail signal of the entire chip to the second generation EEPROM, the compatibility is maintained between the first generation chip and the second generation chip, and the two-gigabit package product using the two first generation chips shown in FIG. 2 can be replaced with the two-gigabit package product using the one second generation chip depicted in FIG. 9.

Table 4 shows statuses when the Pass/Fail signal of the entire chip is outputted and the Pass/Fail signal for each cell array group consisting of a plurality of memory cell arrays is outputted. In this case, as a Pass/Fail output command, com-B is supplied to the chip.

Since the operation to output the Pass/Fail signal of the entire chip has been already described in connection with Table 3, its explanation will be eliminated here.

In the operation to output the Pass/Fail signal for each cell array group consisting of a plurality of memory cell arrays, when a predetermined operation has attained success with respect to all the memory cell arrays in the cell array group, the Pass signal (="0") is outputted from that cell array group. When a predetermined operation has failed with respect to at least one memory cell array in the cell array group, the Fail signal (="1") is outputted from that cell array group. The Pass/Fail signal for each cell array group is outputted from the data input/output terminals I/O 1 to I/O 4.

In case of, e.g., the EEPROM chip shown in FIG. 9, the Pass/Fail signal for each cell array group can be obtained by taking a logical sum (OR) of the Pass/Fail signals respectively outputted from the two memory cell arrays Array0 and Array4 constituting one cell array group (when Pass="0", Fail="1"). This is also true to other cell array groups.

The Pass/Fail signal of the cell array group consisting of the memory cell arrays Array0 and Array4 is outputted from the data input/output terminal I/O 1, the Pass/Fail signal of the cell array group consisting of the memory cell arrays Array1 and Array5 is outputted from the data input/output terminal I/O 2, the Pass/Fail signal of the cell array group consisting of the memory cell arrays Array2 and Array6 is outputted from the data input/output terminal I/O 3, and the Pass/Fail signal of the cell array group consisting of the memory cell arrays Array3 and Array7 is outputted from the data input/output terminal I/O 4.

Statuses of the data input/output terminals I/O 0 to I/O 7 in Table 4 match with statuses of the data input/output terminals I/O 0 to I/O 7 in Table 2. For example, in any case, the Pass/Fail signals are outputted from the data input/output terminals I/O 0 to I/O 4.

Therefore, when providing the function to output the Pass/Fail signal of the entire chip and the function to output the Pass/Fail signal for each cell array group consisting of a plurality of memory cell arrays to the second generation EEPROM, the compatibility is maintained between the first generation chip and the second generation chip, and the two-gigabit package product using the two first generation chips shown in FIG. 2 can be replaced with the two-gigabit package product using the one second chip shown in FIG. 9.

First, in case of a system having two first generation chips mounted in a two-gigabit package product, as shown in FIG. 2, chips are selected based on one-bit chip addresses. The Pass/Fail signal is outputted from only the selected chip. Statuses of the data input/output terminals I/O 0 to I/O 7 in the selected chip at this time are as shown in, e.g., Table 2.

Figure 8:
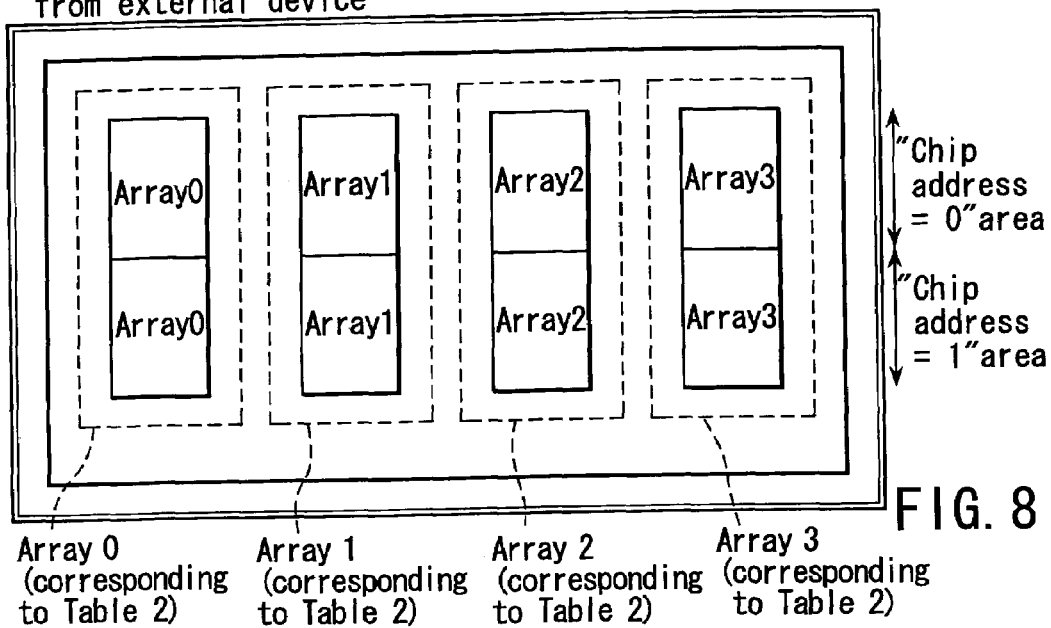
FIG. 8 is a view showing a chip image when the package product depicted in FIG. 2 is seen from an external device.

When a package product is seen from an external device connected to the package product, the package product of FIG. 2 has such a chip image as shown in FIG. 8. In the package product depicted in FIG. 2, when seen from the external device, there can be obtained an image in which one chip exists rather than two chips in the package product, and a chip address which determines one of the two chips to be selected is just seen as one of block address specification addresses. Therefore, as described above, the package product of FIG. 2 has such a chip image as shown in FIG. 8 as seen from the external device. In FIG. 8, one chip is mounted in the package product, and four memory cell arrays Array0, Array1, Array2 and Array3 are arranged in that chip. One memory cell array Arrayi (i=0, 1, 2, 3) is constituted of Array0 of the chip at a chip address 0 and Array0 of the chip at a chip address 1, and selection/non-selection is determined based on an address corresponding to the chip address. This can be also applied to Array1 to Array3.

In this case, when a Pass/Fail output command com-B is inputted to the chip, such a Pass/Fail signal as shown in Table 2 is outputted. At this time, as to the Pass/Fail signal outputted from the data input/output terminal I/O 1, the Pass/Fail signal of Array0 is likewise outputted when a selected chip has either the chip address 0 or 1. This can be also applied to Array1 to Array3.

On the other hand, in case of a package product shown in FIG. 9, when the Pass/Fail output command com-B is inputted to the chip, such a Pass/Fail signal as shown in Table 4 is outputted. Comparing Table 2 with Table 4, output contents of I/O 1 to I/O 4 correspond to the Pass/Fail signal in the both tables. Further, when combinations of areas within the broken line in FIG. 9 are assumed as cell array groups, output contents of I/O 1 to I/O 4 correspond to the Pass/Fail signals of the respective cell array groups "Array0 and Array4", "Array1 and Array5", "Array2 and Array6" and "Array3 and Array7", and it is apparent from a comparison between FIGS. 8 and 9 that these cell array groups can be associated with the cell array groups Array0, Array1, Array2 and Array3 illustrated within the broken line of FIG. 8. Therefore, by providing the function to output the Pass/Fail signal in cell array group units such as shown within the broken line of FIG. 9 (namely, such a function as illustrated in Table 4), the Pass/Fail signal output content of Table 2 of the first generation product can be set equivalent to the Pass/Fail signal output content of Table 4 of the second generation product. In this case, in the system using the same command com-B, since it is possible to realize normal operations of both the first generation product such as shown in FIG. 2 and the second generation product illustrated in FIG. 9, the first generation product such as depicted in FIG. 2 can be thereby readily substituted by the second generation product shown in FIG. 9.

It is to be noted that the system which outputs one Pass/Fail signal from the cell array group means, e.g., a system which takes a logical sum (OR) of the Pass/Fail signals respectively outputted from a plurality of memory cell arrays constituting the cell array group and determines it as the Pass/Fail signal of the cell array group (when Pass="0", Fail="1").

Although the description has been given as to the case that the number of memory cell arrays (memory capacity) of the second generation chip is twofold of the number of memory cell arrays (memory capacity) of the first generation chip in this example, the present invention can be generally applied to the case that the number of memory cell arrays is n (n is a natural number). In this case, the number of memory cell arrays in the cell array group becomes equal in all the cell array groups.

Furthermore, the present invention is not restricted to this case, and it can be applied to a case that the number of memory cell arrays of the second chip is simply larger than the number of memory cell arrays of the first generation chip. In this case, the number of memory cell arrays in the cell array group is not fixed.

Although a signal obtained by taking a logical sum of the Pass/Fail signals from the plurality of memory cell arrays in the cell array group is outputted from that cell array group in this example, a logical product (AND) is taken when Pass="1" and Fail="0".

Moreover, although the cell array group outputs one signal obtained by taking a logical sum or a logical product of the Pass/Fail signals of the plurality of memory cell arrays in that cell array group, the Pass/Fail signals of the plurality of memory cell arrays in that cell array group may be selectively outputted alternatively.

As described above, according to the present invention, in addition to the function to output the Pass/Fail signal of the entire chip and the function to output the Pass/Fail signal for each memory cell array, the cell array group consisting of the plurality of memory cell arrays is newly set, and a function to output the Pass/Fail signal for each cell array group is newly provided.

Therefore, in regard to a system which outputs the Pass/Fail signal, since the compatibility can be provided between the precedent generation chip and the next generation chip, replacement from the precedent generation chip to the next generation chip can be facilitated with respect to the same package product, thereby reducing a chip cost.

A description will now be given as to the non-volatile semiconductor memory according to the present invention, and an example to add the function to output the Pass/Fail signal for each memory cell array.

Table 5 shows an example of allocation of the Pass/Fail signal to the data input/output terminals I/O 0 to I/O 7 in the second generation EEPROM chip depicted in FIG. 9.

TABLE 5

(c) com-C

| | STATUS | OUTPUT |
|---|---|---|
| I/O0 | Array (0) Status | Pass → 0 Fail → 1 |
| I/O1 | Array (1) Status | Pass → 0 Fail → 1 |
| I/O2 | Array (2) Status | Pass → 0 Fail → 1 |
| I/O3 | Array (3) Status | Pass → 0 Fail → 1 |
| I/O4 | Array (4) Status | Pass → 0 Fail → 1 |
| I/O5 | Array (5) Status | Pass → 0 Fail → 1 |
| I/O6 | Array (6) Status | Pass → 0 Fail → 1 |
| I/O7 | Array (7) Status | Pass → 0 Fail → 1 |

When only replacement from the first generation chip to the second generation chip is considered with respect to the same package product, for example, stipulating statuses (Table 3 and Table 4) of the data input/output terminals I/O 0 to I/O 7 in the second generation chip depicted in FIG. 9 relative to statuses (Table 1 and Table 2) of the data input/output terminals I/O 0 to I/O 7 in the first generation chip illustrated in FIG. 2 can suffice.

However, for example, one of characteristics of the second generation chip shown in FIG. 9 lies in a high-speed operation function realized by causing the eight memory cell arrays Array0, Array1, Array2, Array3, Array4, Array5, Array6 and Array7 to perform the parallel operation.

In order to make this high-speed operation function effective, it is important to cause the eight memory cell arrays Array0, Array1, Array2, Array3, Array4, Array5, Array6 and Array7 to perform the parallel operation and add the function to output the Pass/Fail signal for each memory cell array.

Thus, the function to output the Pass/Fail signal for each memory cell array is added to the second generation EEPROM chip depicted in FIG. 9. In order to carry out this function, supplying, e.g., com-C to the chip as a Pass/Fail output command can suffice.

In this case, allocation of the Pass/Fail signal to the data input/output terminals I/O 0 to I/O 7 is as shown in Table 5, for example. That is, the eight Pass/Fail signals outputted from the eight memory cell arrays Array0, Array1, Array2, Array3, Array4, Array5, Array6 and Array7 are outputted from the eight data input/output terminals I/O 0 to I/O 7.

Since the function to output the Pass/Fail signal for each memory cell array is added in this example in this manner, replacement from the first generation chip to the second generation chip can be facilitated with respect to the same package, and the high-speed operation function in the second generation chip can be realized.

A modification of the non-volatile semiconductor memory according to the present invention will now be described.

Although the cell array group outputs one signal obtained by taking a logical sum or a logical product of the Pass/Fail signals of the plurality of memory cell arrays in that cell array group in the above example, the Pass/Fail signals of the plurality of memory cell arrays in that cell array group are selectively outputted in this example.

In this manner, the Pass/Fail signal of one selected memory cell array in the cell array group is outputted in accordance with each cell array group.

Table 6 to Table 9 show examples of allocation of the Pass/Fail signal to the data input/output terminals I/O 0 to I/O 7 in the second generation EEPROM chip depicted in FIG. 9.

TABLE 6

(a) com-A

| | STATUS | OUTPUT |
|---|---|---|
| I/O0 | Chip Status-I | Pass → 0 Fail → 1 |
| I/O1 | Not Used | 0 |
| I/O2 | Not Used | 0 |
| I/O3 | Not Used | 0 |
| I/O4 | Not Used | 0 |
| I/O5 | Not Used | 0 |
| I/O6 | Ready/Busy | Busy → 0 Ready → 1 |
| I/O7 | Write Protect | Protect → 0 Not Protect → 1 |

When a command com-A is inputted, the Pass/Fail signal of the entire chip is outputted. Statuses of the data input/output terminals I/O 0 to I/O 7 at this time are as shown in Table 6.

TABLE 7

(b) com-B

| | STATUS | OUTPUT |
|---|---|---|
| I/O0 | Chip Status-I | Pass → 0 Fail → 1 |
| I/O1 | Array (0) Status | Pass → 0 Fail → 1 |
| I/O2 | Array (1) Status | Pass → 0 Fail → 1 |
| I/O3 | Array (2) Status | Pass → 0 Fail → 1 |
| I/O4 | Array (3) Status | Pass → 0 Fail → 1 |
| I/O5 | Not Used | 0 |
| I/O6 | Ready/Busy | Busy → 0 Ready → 1 |
| I/O7 | Write Protect | Protect → 0 Not Protect → 1 |

When a command com-B is inputted, the Pass/Fail signal for each cell array group is outputted. Statuses of the data input/output terminals I/O 0 to I/O 7 are as shown in Table 7.

Four memory cell arrays Array0, Array1, Array2 and Array3 are selected from the eight memory cell arrays Array0, Array1, Array2, Array3, Array4, Array5, Array6 and Array7 in the four cell array groups. The Pass/Fail signals of the selected memory cell arrays Array0, Array1, Array2 and Array3 are outputted in accordance with each cell array group.

TABLE 8

(c) com-C

| | STATUS | OUTPUT |
|---|---|---|
| I/O0 | Chip Status-I | Pass → 0 Fail → 1 |
| I/O1 | Array (4) Status | Pass → 0 Fail → 1 |
| I/O2 | Array (5) Status | Pass → 0 Fail → 1 |
| I/O3 | Array (6) Status | Pass → 0 Fail → 1 |
| I/O4 | Array (7) Status | Pass → 0 Fail → 1 |
| I/O5 | Not Used | 0 |
| I/O6 | Ready/Busy | Busy → 0 Ready → 1 |
| I/O7 | Write Protect | Protect → 0 Not Protect → 1 |

When a command com-C is inputted, the Pass/Fail signal for each cell array group is outputted. Statuses of the data input/output terminals I/O 0 to I/O 7 at this time are as shown in Table 8.

Four memory cell arrays Array4, Array5, Array6 and Array7 are selected from the eight memory cell arrays Array0, Array1, Array2, Array3, Array4, Array5, Array6 and Array7 in the four cell array groups. The Pass/Fail signals of the selected memory cell arrays Array4, Array5, Array6 and Array7 are outputted in accordance with each cell array group.

TABLE 9

(d) com-D

| | STATUS | OUTPUT |
|---|---|---|
| I/O0 | Array (0) Status | Pass → 0 Fail → 1 |
| I/O1 | Array (1) Status | Pass → 0 Fail → 1 |
| I/O2 | Array (2) Status | Pass → 0 Fail → 1 |
| I/O3 | Array (3) Status | Pass → 0 Fail → 1 |
| I/O4 | Array (4) Status | Pass → 0 Fail → 1 |
| I/O5 | Array (5) Status | Pass → 0 Fail → 1 |
| I/O6 | Array (6) Status | Pass → 0 Fail → 1 |
| I/O7 | Array (7) Status | Pass → 0 Fail → 1 |

When a command com-D is inputted, the Pass/Fail signal for each memory cell array is outputted. Statuses of the data input/output terminals I/O 0 to I/O 7 at this time are as shown in Table 9.

In this example, the statuses in Table 6 are equal to those in Table 1. Further, the statuses in Table 7 and Table 8 are equal to the status in Table 2. Therefore, replacement from the first generation chip to the second generation chip with respect to the same package product can be facilitated. Furthermore, providing the function to output the Pass/Fail signal for each memory cell array such as shown in Table 9 can realize the high-speed operation function in the second generation chip.

Although the present invention has been described above, it is not restricted thereto, and it can be modified in many ways.

In the above example, the description has been given as to the case that the two first generation chips are replaced with the one second generation chip with respect to the same package product when the first generation EEPROM chip has the four memory cell arrays and the second generation EEPROM chip has the eight memory cell arrays.

On the other hand, the present invention can be applied to, e.g., a case that the four first generation chips are replaced with the two second generation chips or the two second generation chips are replaced with the one third generation chip with respect to the same package product when the first generation EEPROM chip has the four memory cell arrays, the second EEPROM chip has the eight memory cell arrays and the third generation EEPROM chip has the 16 memory cell arrays.

(2) EMBODIMENT2

Replacement of Chips with Respect to Four-Gigabit Package Product

Figure 10:
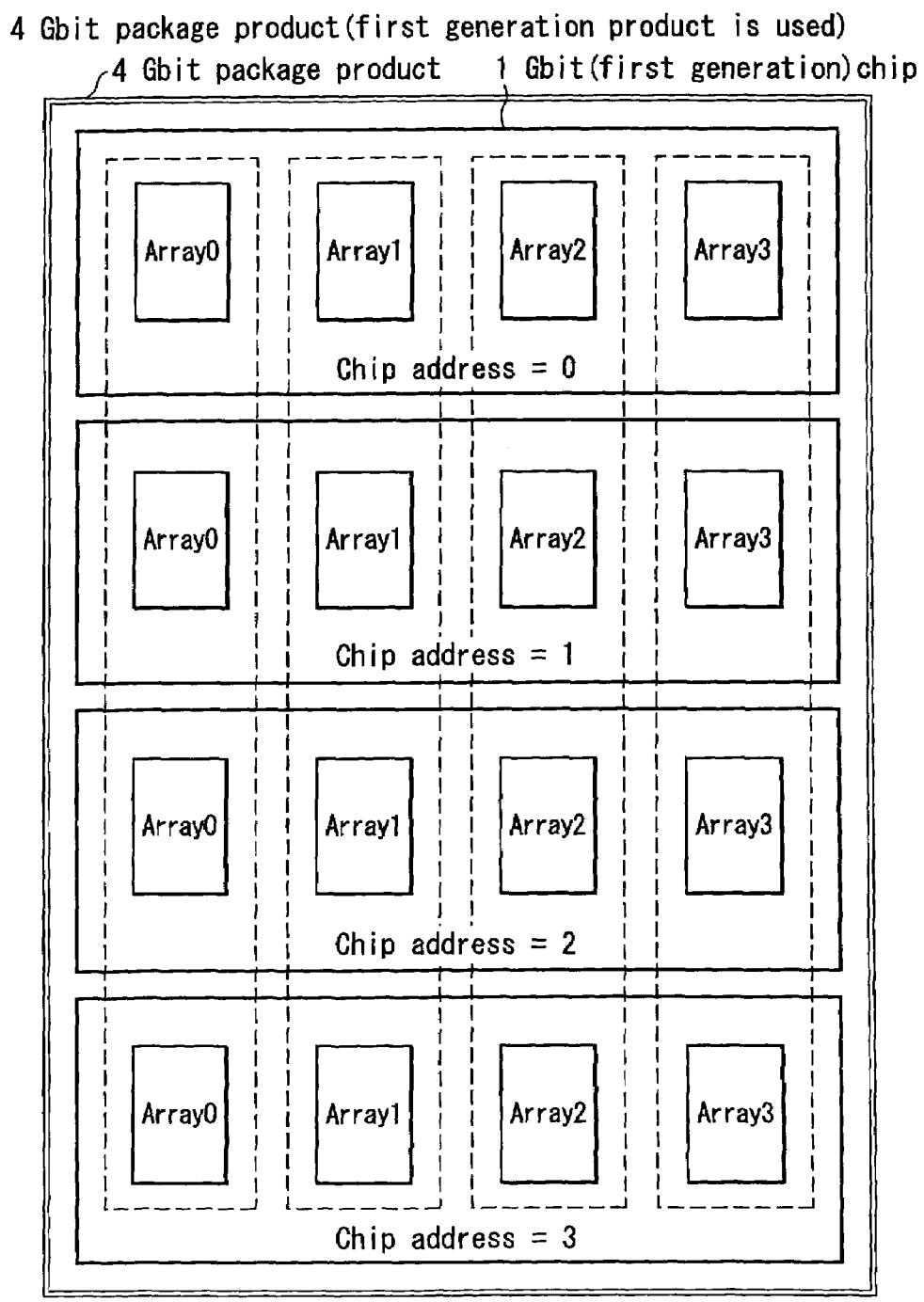
FIG. 10 is a view showing a package product having four first generation chips mounted thereon.
Figure 11:
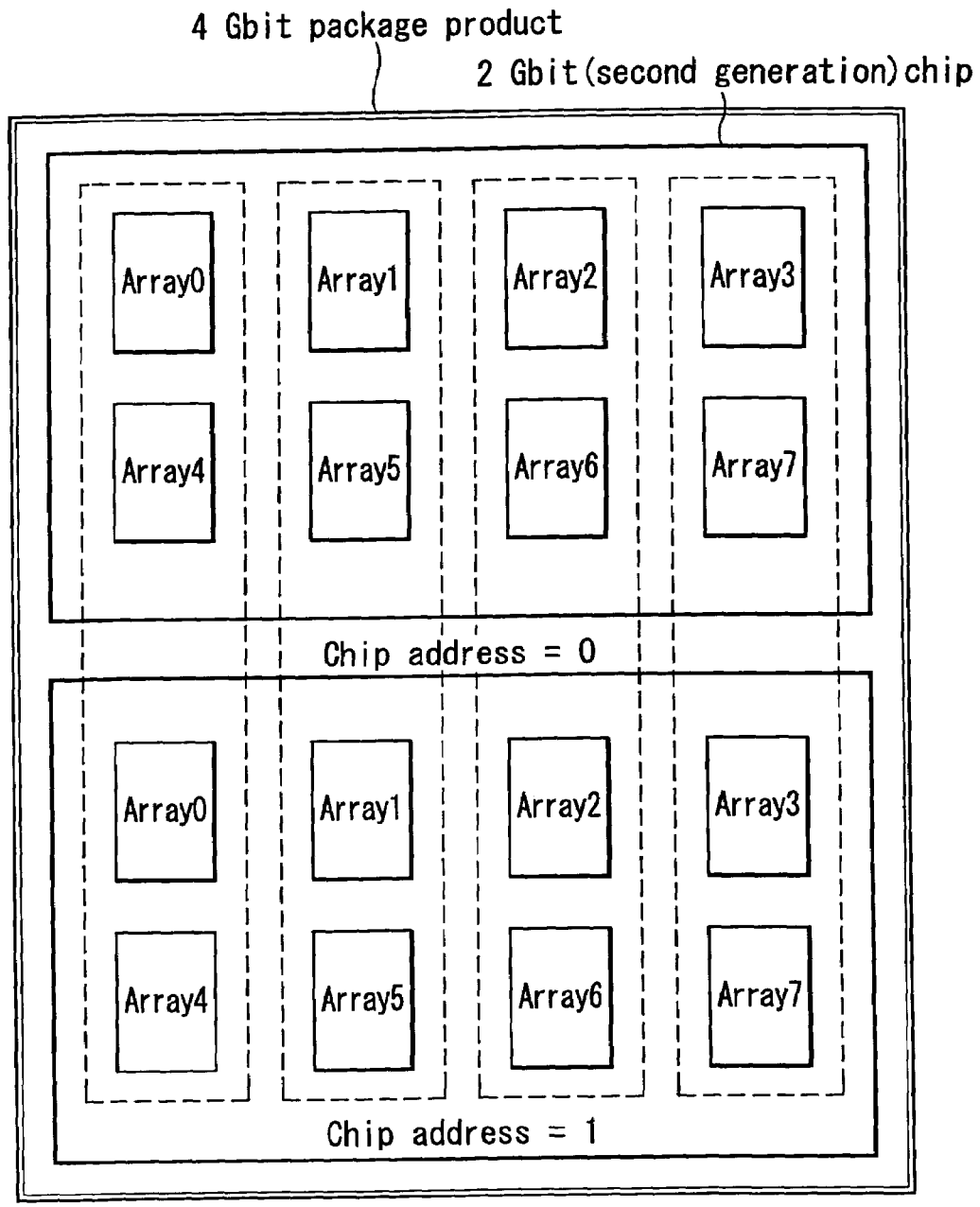
FIG. 11 is a view showing a package product having two second generation chips mounted thereon.
Figure 12:
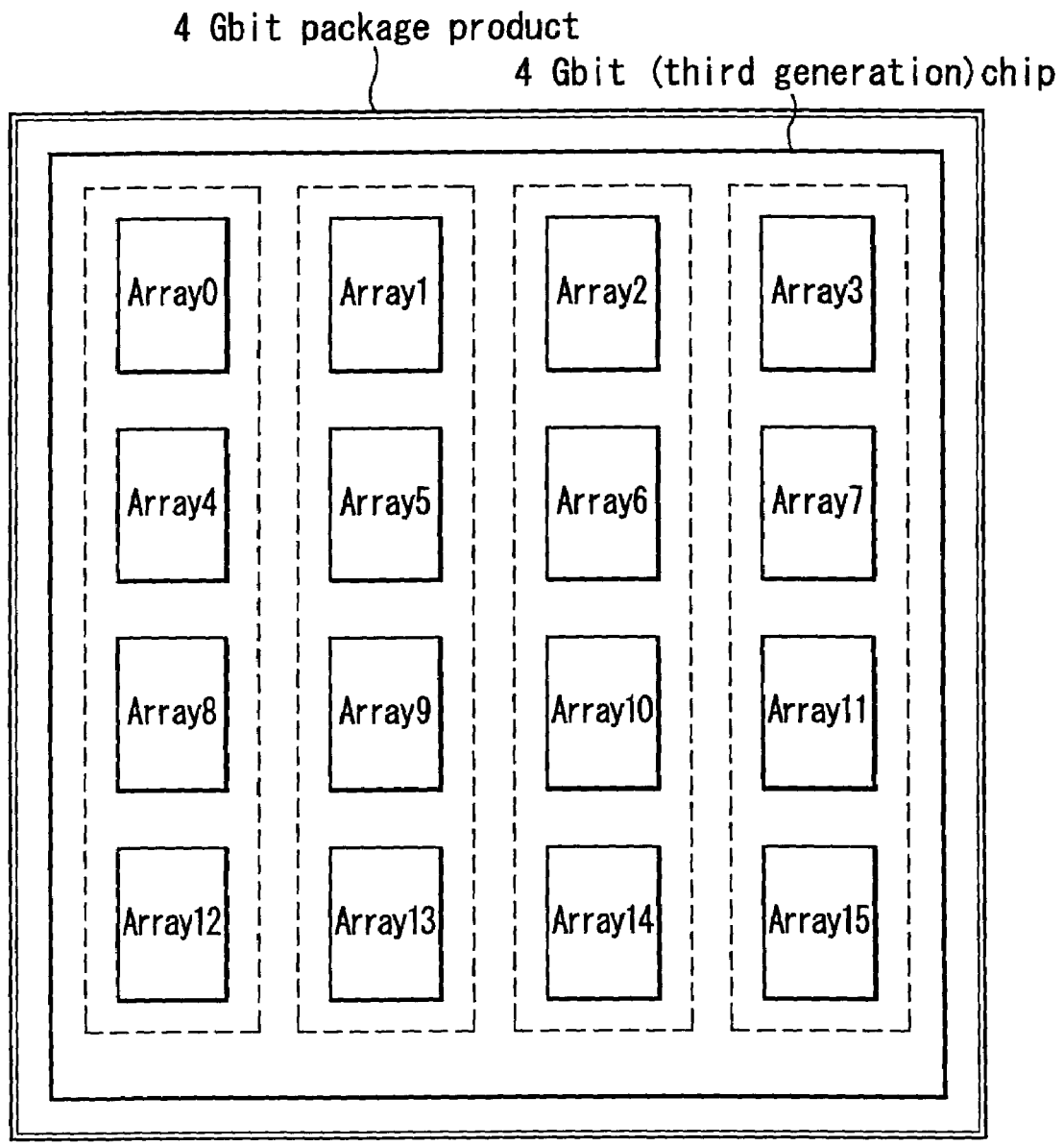
FIG. 12 is a view showing a package product having one third generation chip mounted thereon.

FIG. 10 shows an example that four first generation chips are mounted in a four-gigabit package product. FIG. 11 shows an example that two second generation chips are mounted in a four-gigabit package product. FIG. 12 shows an example that one third generation chip is mounted in a four-gigabit package product.

In this manner, replacement from the first generation chip to the second generation chip and replacement from the second generation chip to the third generation chip can be executed with respect to the same package product.

Here, it is assumed that the first generation chip has four memory cell arrays and a one-gigabit memory capacity, the second generation chip has eight memory cell arrays and a two-gigabit memory capacity, and the third generation chip has 16 memory cell arrays and a four-gigabit memory capacity.

Like the first generation EEPROM chip shown in FIG. 2, the first generation EEPROM chip depicted in FIG. 10 has a function to output a Pass/Fail signal of the entire chip illustrated in Table 1 and a function to output a Pass/Fail signal for each memory cell array shown in Table 2.

Like the second generation EEPROM chip shown in FIG. 9, the second generation EEPROM chip depicted in FIG. 11 has a function to output a Pass/Fail signal of the entire chip illustrated in Table 3 or Table 6 and a function to output a Pass/Fail signal for each cell array group shown in Table 4 or Tables 7 and 8. Further, like the second generation EEPROM chip shown in FIG. 9, to the second generation EEPROM chip depicted in FIG. 11 may be added a function to output a Pass/Fail signal for each memory cell array illustrated in Table 5 or Table 9.

The third generation EEPROM chip shown in FIG. 12 has a function to output a Pass/Fail signal of the entire chip illustrated in Table 10 and a function to output a Pass/Fail signal for each cell array group depicted in Table 11.

The function shown in Table 11 takes a logical sum or a logical product of Pass/Fail signals of a plurality of memory cell arrays in a cell array group, but it may be substituted by a function to output a Pass/Fail signal of a selected memory cell array like the cases shown in Table 7 and Table 8.

TABLE 10

(a) com-A

| | STATUS | OUTPUT |
|---|---|---|
| I/O0 | Chip Status-I | Pass → 0 Fail → 1 |
| I/O1 | Not Used | 0 |
| I/O2 | Not Used | 0 |
| I/O3 | Not Used | 0 |
| I/O4 | Not Used | 0 |
| I/O5 | Not Used | 0 |
| I/O6 | Ready/Busy | Busy → 0 Ready → 1 |
| I/O7 | Write Protect | Protect → 0 Not Protect → 1 |

TABLE 11

(b) com-B

| | STATUS | OUTPUT |
|---|---|---|
| I/O0 | Chip Status-I | Pass → 0 Fail → 1 |
| I/O1 | Array (0), Array (4), Array (8) or Array (12) Status | Pass → 0 Fail → 1 |
| I/O2 | Array (1), Array (5), Array (9) or Array (13) Status | Pass → 0 Fail → 1 |
| I/O3 | Array (2), Array (6), Array (10) or Array (14) Status | Pass → 0 Fail → 1 |
| I/O4 | Array (3), Array (7), Array (11) or Array (15) Status | Pass → 0 Fail → 1 |
| I/O5 | Not Used | 0 |

TABLE 11-continued (b) com-B

| | STATUS | OUTPUT |
|---|---|---|
| I/O6 | Ready/Busy | Busy → 0 Ready → 1 |
| I/O7 | Write Protect | Protect → 0 Not Protect → 1 |

Furthermore, a function to output a Pass/Fail signal for each memory cell array shown in Table 12 and Table 13 may be added to the third generation EEPROM chip depicted in FIG. 12.

TABLE 12

(c) com-C

| | STATUS | OUTPUT |
|---|---|---|
| I/O0 | Array (0) Status | Pass → 0 Fail → 1 |
| I/O1 | Array (1) Status | Pass → 0 Fail → 1 |
| I/O2 | Array (2) Status | Pass → 0 Fail → 1 |
| I/O3 | Array (3) Status | Pass → 0 Fail → 1 |
| I/O4 | Array (4) Status | Pass → 0 Fail → 1 |
| I/O5 | Array (5) Status | Pass → 0 Fail → 1 |
| I/O6 | Array (6) Status | Pass → 0 Fail → 1 |
| I/O7 | Array (7) Status | Pass → 0 Fail → 1 |

TABLE 13

(d) com-D

| | STATUS | OUTPUT |
|---|---|---|
| I/O0 | Array (8) Status | Pass → 0 Fail → 1 |
| I/O1 | Array (9) Status | Pass → 0 Fail → 1 |
| I/O2 | Array (10) Status | Pass → 0 Fail → 1 |
| I/O3 | Array (11) Status | Pass → 0 Fail → 1 |
| I/O4 | Array (12) Status | Pass → 0 Fail → 1 |
| I/O5 | Array (13) Status | Pass → 0 Fail → 1 |
| I/O6 | Array (14) Status | Pass → 0 Fail → 1 |
| I/O7 | Array (15) Status | Pass → 0 Fail → 1 |

In FIG. 12, since there are only the eight data input/output terminals I/O 0 to I/O 7 with respect to the 16 memory cell arrays Array0, Array1, Array2, Array3, Array4, Array5, Array6, Array7, Array8, Array9, Array10, Array11, Array12, Array13, Array14 and Array15, the Pass/Fail signals for the respective memory cell arrays are read in two steps (com-C, com-D) as shown in Table 12 and Table 13.

It can be said that the function shown in Table 12 and Table 13 is a function to output the Pass/Fail signals of a plurality of selected memory cell arrays in the cell array group in accordance with each cell array group.

Figure 13:
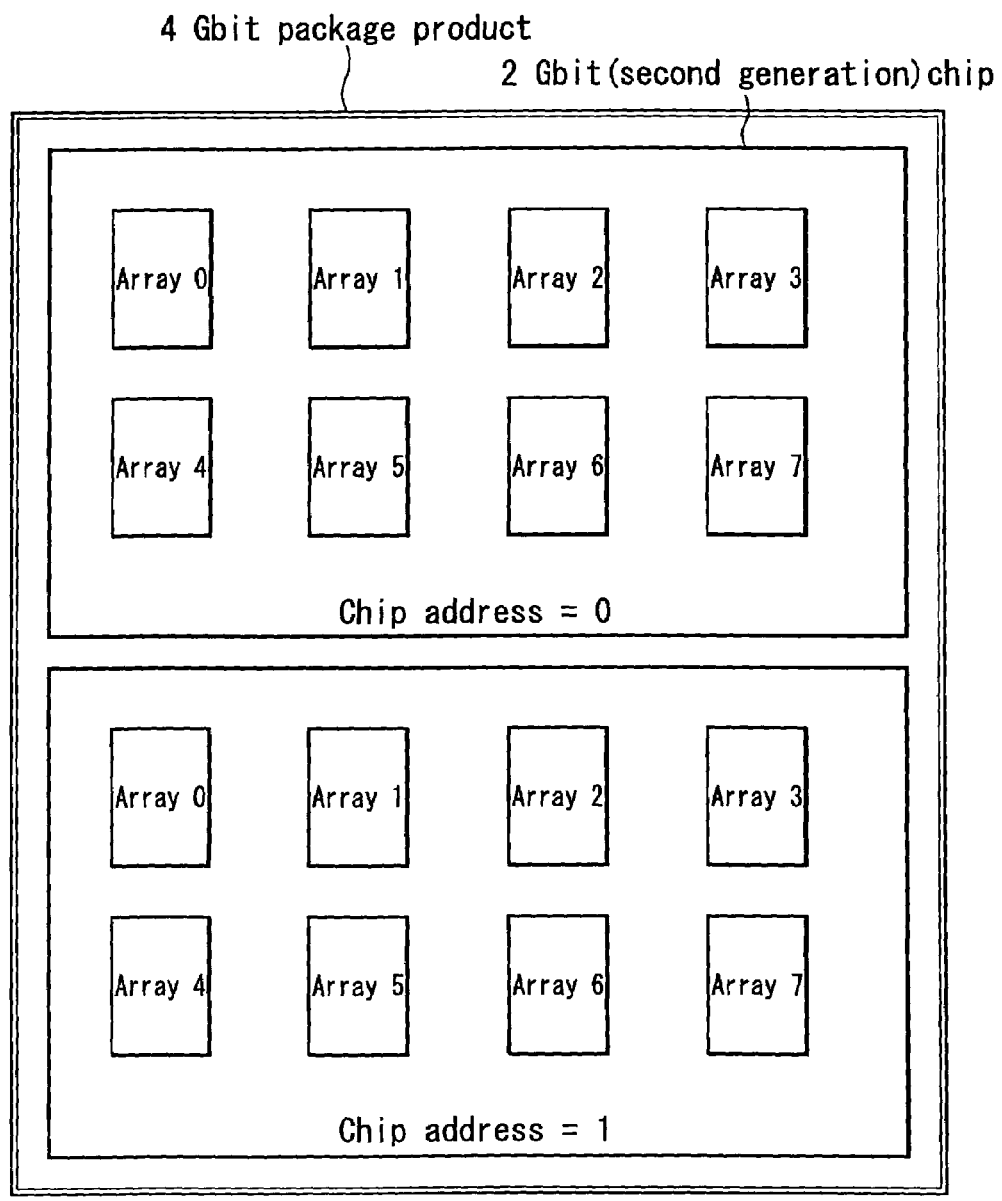
FIG. 13 is a view showing a package product having two second generation chips mounted thereon.
Figure 14:
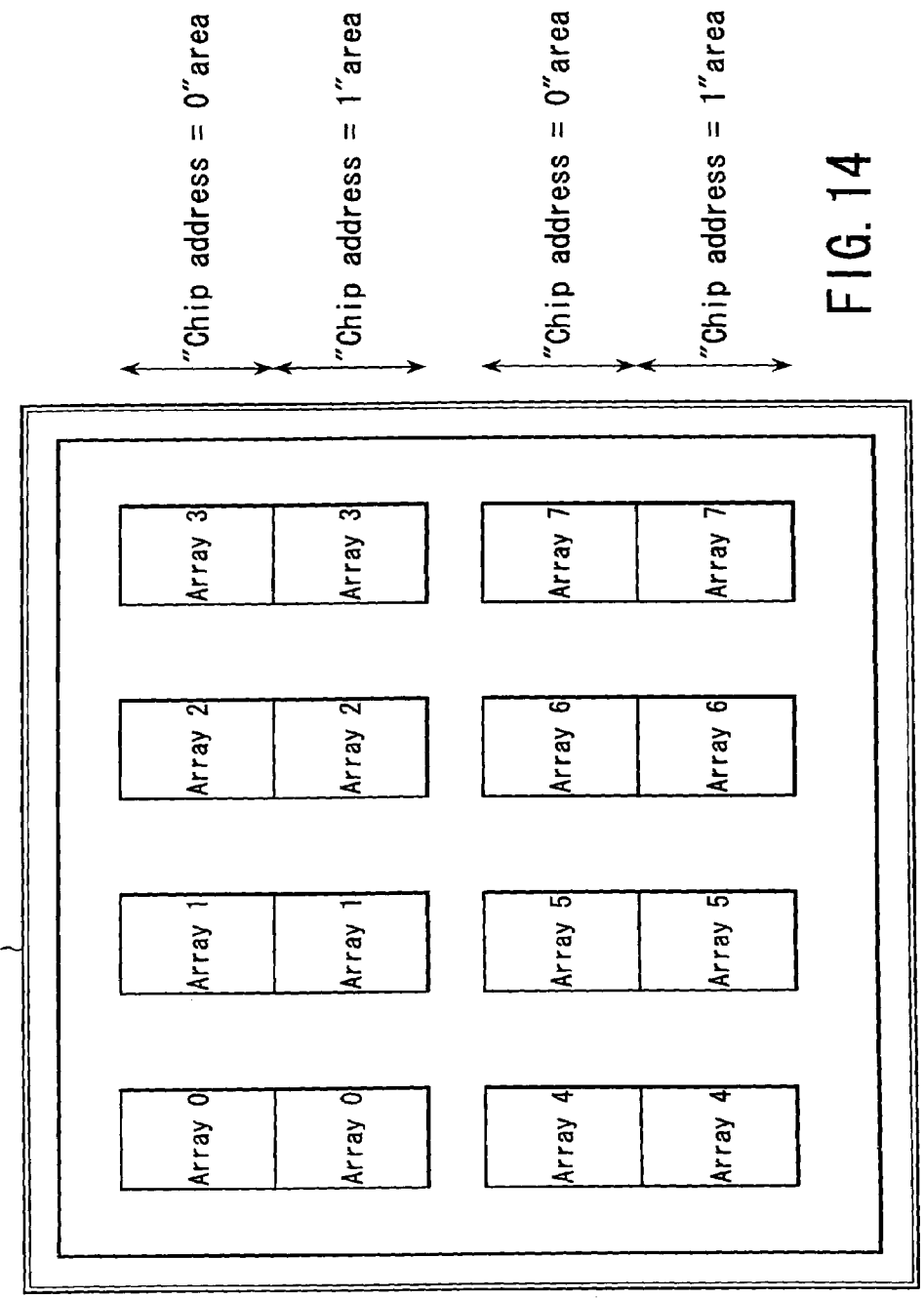
FIG. 14 is a view showing a chip image when the package product depicted in FIG. 13 is seen from an external device.
Figure 15:
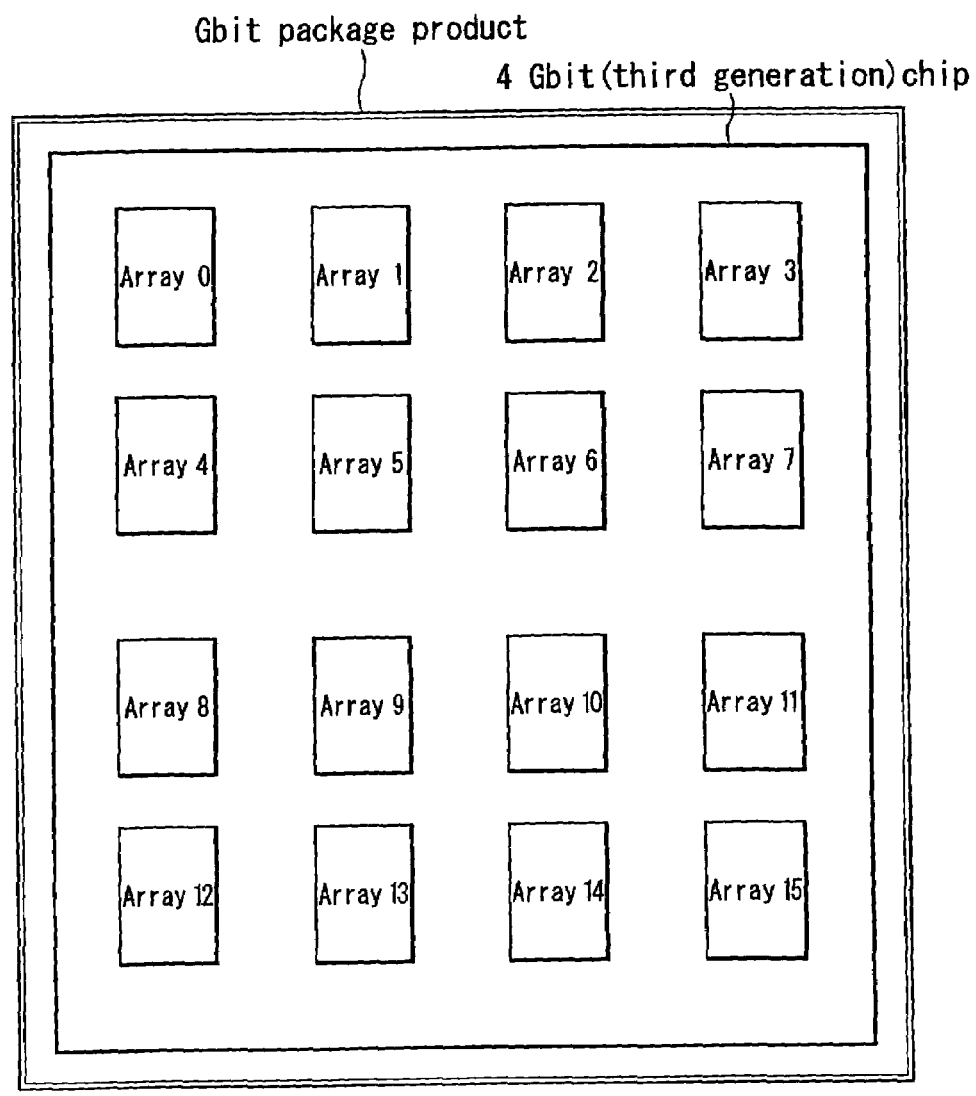
FIG. 15 is a view showing a package product having one third generation chip mounted thereon.

FIG. 13 shows an example that two second generation chips are mounted in a four-gigabit package product. FIG. 14 shows a chip image when the package product of FIG. 13 is seen from an external device. FIG. 15 shows an example that one third generation chip is mounted in a four-gigabit package product.

Like the second generation EEPROM chip shown in FIG. 9, the second generation EEPROM chip depicted in FIG. 13 has a function to output a Pass/Fail signal of the entire chip illustrated in Table 3 or Table 6 and a function to output a Pass/Fail signal for each cell array group shown in Table 4 or Tables 7 and 8. Moreover, like the second generation EEPROM chip shown in FIG. 9, to the second generation EEPROM chip depicted in FIG. 11 may be added a function to output a Pass/Fail signal for each memory cell array illustrated in Table 5 or Table 9.

The third generation EEPROM chip shown in FIG. 15 has a function to output a Pass/Fail signal of the entire chip illustrated in Table 14 and a function to output a Pass/Fail signal for each cell array group depicted in Table 15.

Although the function of Table 15 takes a logical sum or a logical product of Pass/Fail signals of a plurality of memory cell arrays in a cell array group, it may be substituted by a function to output a Pass/Fail signal of a selected memory cell array like the cases of Table 7 and Table 8.

TABLE 14

(a) com-A

| | STATUS | OUTPUT |
|---|---|---|
| I/O0 | Chip Status-I | Pass → 0 Fail → 1 |
| I/O1 | Not Used | 0 |
| I/O2 | Not Used | 0 |
| I/O3 | Not Used | 0 |
| I/O4 | Not Used | 0 |
| I/O5 | Not Used | 0 |
| I/O6 | Ready/Busy | Busy → 0 Ready → 1 |
| I/O7 | Write Protect | Protect → 0 Not Protect → 1 |

TABLE 15

(b) com-B

| | STATUS | OUTPUT |
|---|---|---|
| I/O0 | Chip Status-I | Pass → 0 Fail → 1 |
| I/O1 | Array (0), Array (4), Array (8) or Array (12) Status | Pass → 0 Fail → 1 |
| I/O2 | Array (1), Array (5), Array (9) or Array (13) Status | Pass → 0 Fail → 1 |
| I/O3 | Array (2), Array (6), Array (10) or Array (14) Status | Pass → 0 Fail → 1 |
| I/O4 | Array (3), Array (7), Array (11) or Array (15) Status | Pass → 0 Fail → 1 |
| I/O5 | Not Used | 0 |
| I/O6 | Ready/Busy | Busy → 0 Ready → 1 |
| I/O7 | Write Protect | Protect → 0 Not Protect → 1 |

Additionally, a function to output a Pass/Fail signal for each memory cell array shown in Table 16 and Table 17 may be added to the third generation EEPROM chip illustrated in FIG. 15.

TABLE 16

(c) com-C

| | STATUS | OUTPUT |
|---|---|---|
| I/O0 | Array (0) Status | Pass → 0 Fail → 1 |
| I/O1 | Array (1) Status | Pass → 0 Fail → 1 |
| I/O2 | Array (2) Status | Pass → 0 Fail → 1 |
| I/O3 | Array (3) Status | Pass → 0 Fail → 1 |
| I/O4 | Array (4) Status | Pass → 0 Fail → 1 |

TABLE 16-continued (c) com-C

| | STATUS | OUTPUT |
|---|---|---|
| I/O5 | Array (5) Status | Pass → 0 Fail → 1 |
| I/O6 | Array (6) Status | Pass → 0 Fail → 1 |
| I/O7 | Array (7) Status | Pass → 0 Fail → 1 |

TABLE 17

(d) com-D

| | STATUS | OUTPUT |
|---|---|---|
| I/O0 | Array (8) Status | Pass → 0 Fail → 1 |
| I/O1 | Array (9) Status | Pass → 0 Fail → 1 |
| I/O2 | Array (10) Status | Pass → 0 Fail → 1 |
| I/O3 | Array (11) Status | Pass → 0 Fail → 1 |
| I/O4 | Array (12) Status | Pass → 0 Fail → 1 |
| I/O5 | Array (13) Status | Pass → 0 Fail → 1 |
| I/O6 | Array (14) Status | Pass → 0 Fail → 1 |
| I/O7 | Array (15) Status | Pass → 0 Fail → 1 |

In FIG. 15, since there are only the eight data input/output terminals I/O 0 to I/O 7 with respect to the 16 memory cell arrays Array0, Array1, Array2, Array3, Array4, Array5, Array6, Array7, Array8, Array9, Array10, Array11, Array12, Array13, Array14 and Array15, the Pass/Fail signals for the respect memory cell arrays are read in two steps (com-C, com-D) as shown in Table 16 and Table 17.

In this example, further, the function to take a logical sum or a logical product of the Pass/Fail signals of a plurality of memory cell arrays in a cell array group shown in Table 15 may be combined with the function to output a Pass/Fail signal for each memory cell array depicted in Table 16 and Table 17.

TABLE 18

(e) com-E

| | STATUS | OUTPUT |
|---|---|---|
| I/O0 | Array (0) or Array (8) Status | Pass → 0 Fail → 1 |
| I/O1 | Array (1) or Array (9) Status | Pass → 0 Fail → 1 |
| I/O2 | Array (2) or Array (10) Status | Pass → 0 Fail → 1 |
| I/O3 | Array (3) or Array (11) Status | Pass → 0 Fail → 1 |
| I/O4 | Array (4) or Array (12) Status | Pass → 0 Fail → 1 |
| I/O5 | Array (5) or Array (13) Status | Pass → 0 Fail → 1 |
| I/O6 | Array (6) or Array (14) Status | Pass → 0 Fail → 1 |
| I/O7 | Array (7) or Array (15) Status | Pass → 0 Fail → 1 |

The function of Table 18 takes a logical sum or a logical product of Pass/Fail signals of, e.g., the memory cell arrays Array0 and Array8 shown in FIG. 15, and outputs a result from the data input/output terminal I/O 0 as a Pass/Fail output of a cell array group consisting of the memory cell arrays Array0 and Array8.

Likewise, a logical sum or a logical product of Pass/Fail signals of the memory cell arrays Array1 and Array9 is obtained, and its result is outputted from the data input/ output terminal I/O 1 as a Pass/Fail output of a cell array group consisting of the memory cell arrays Array1 and Array9.

A logical sum or a logical product of Pass/Fail signals of the memory cell arrays Array2 and Array10 is obtained, and its result is outputted from the data input/output terminal I/O 2 as a Pass/Fail output of a cell array group consisting of the memory cell arrays Array2 and Array10.

A logical sum or a logical product of Pass/Fail signals of the memory cell arrays Array3 and Array11 is obtained, and its result is outputted from the data input/output terminal I/O 3 as a Pass/Fail output of a cell array group consisting of the memory cell arrays Array3 and Array11.

A logical sum or a logical product of Pass/Fail signals of the memory cell arrays Array4 and Array12 is obtained, and its result is outputted from the data input/output terminal I/O 4 as a Pass/Fail output of a cell array group consisting of the memory cell arrays Array4 and Array12.

A logical sum or a logical product of Pass/Fail signals of the memory cell arrays Array5 and Array13 is obtained, and its result is outputted from the data input/output terminal I/O 5 as a Pass/Fail output of a cell array group consisting of the memory cell arrays Array5 and Array13.

A logical sum or a logical product of Pass/Fail signals of the memory cell arrays Array6 and Array14 is obtained, and its result is outputted from the data input/output terminal I/O 6 as a Pass/Fail output of a cell array group consisting of the memory cell arrays Array6 and Array14.

A logical sum or a logical product of Pass/Fail signals of the memory cell arrays Array7 and Array15 is obtained, and its result is outputted from the data input/output terminal I/O 7 as a Pass/Fail output of a cell array group consisting of the memory cell arrays Array7 and Array15.

(3) Others

Although the description has been given as to the case that the number of memory cells which constitute one NAND cell and are connected in series is eight in the above example, one NAND cell may be constituted of, e.g., 2, 4, 16, 32 or 64 memory cells in place of eight memory cells.

The present invention can be also applied to a so-called 3tr-NAND cell in which only one memory cell is arranged between two selection transistors.

Although the above example has described the NAND cell type EEPROM, the present invention can be likewise applied to any other device than the NAND cell type EEPROM, e.g., an NOR cell type EEPROM, a DINOR cell type EEPROM, an AND cell type EEPROM, an NOR cell type EEPROM with selection transistors, and others.

It is to be noted that the detail of the DINOR cell type EEPROM is described in, e.g., "H. Onoda et al., IEDM Tech. Digest, 1992, pp. 599-602" and the detail of the AND cell type EEPROM is described in, e.g., "H. Kume et al., IEDM Tech. Digest, 1992, pp. 991-993".

The present invention is mainly applied to the non-volatile semiconductor memory in which information can be electrically reprogrammed, but it can be considered that the present invention can be also applied to, e.g., any other non-volatile semiconductor memory, a DRAM or an SRAM.

Although the present invention has been described in connection with the embodiments, the present invention can be modified in many ways without departing from the scope of the invention.

According to the example of the present invention, when output a Pass/Fail result concerning a chip operation, it is possible to output a Pass/Fail signal of the entire chip and a Pass/Fail signal for each memory cell as well as a Pass/Fail signal for each cell array group consisting of a plurality of memory cell arrays in a chip. As a result, providing one or more cell array groups in the later generation chip enables replacement from the precedent generation chip to the later generation chip with respect to the same package product.

Incidentally, when replacing from the precedent generation chip to the later generation chip, it is good to make the number of cell groups in the later generation chip equal to the number of memory cell arrays or the number of cell groups in the precedent generation chip.

Since this replacement is possible, the later generation chip with a lower chip cost can be used in a high-capacity package product, thereby realizing an inexpensive package product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
   a plurality of memory cell arrays having a plurality of memory cells or memory cell units each of which include a plurality of memory cells, arranged in a matrix, the plurality of memory cell arrays being located independently of each other;
   a first memory cell array included in the plurality of memory cell arrays;
   a second memory cell array included in the plurality of memory cell arrays;
   a third memory cell array included in the plurality of memory cell arrays;
   a fourth memory cell array included in the plurality of memory cell arrays;
   a first memory cell array group including the first memory cell array and the second memory cell array; and
   a second memory cell array group including the third memory cell array and the fourth memory cell array,
   wherein the first memory cell array, the second memory cell array, the third memory cell array and the fourth memory cell array are different from one another, a first Pass/Fail signal indicative of success or failure of an operation is outputted in accordance with each of the first memory cell array group and the second memory cell array group.

2. The semiconductor memory device according to claim 1, wherein the operation includes a parallel operation with respect to both of memory cells in the first memory cell array group and memory cells in the second memory cell array group.

3. The semiconductor memory device according to claim 1, wherein the operation includes a parallel operation with respect to memory cells in two or more of the plurality of memory cell arrays.

4. The semiconductor memory device according to claim 1, wherein the operation is a program or erase operation.

5. The semiconductor memory device according to claim 1, wherein the first Pass/Fail signal is a Pass/Fail signal indicating whether the operation has attained success with respect to all of selected memory cells included in each of the first memory cell array group and the second memory cell array group or not.

6. The semiconductor memory device according to claim 1, wherein a second Pass/Fail signal of an entire chip is also outputted when the first Pass/Fail signal is outputted.

7. The semiconductor memory device according to claim 1, wherein the first Pass/Fail signal is a Pass/Fail signal indicating whether the operation has attained success with respect to one memory cell array selected from the two or more memory cell arrays in each of the first memory cell array group and the second memory cell array group or not.

8. The semiconductor memory device according to claim 1, wherein the first Pass/Fail signal is outputted after a first command is inputted.

9. The semiconductor memory device according to claim 8, wherein the first Pass/Fail signal is not outputted and a third Pass/Fail signal which is different from the first Pass/Fail signal is outputted after a second command is inputted.

10. The semiconductor memory device according to claim 8, wherein a fourth Pass/Fail signal is outputted with respect to each of the memory cell arrays included in an entire chip after a third command is input.

11. The semiconductor memory device according to claim 10, wherein the third command is different from the first command.

12. The semiconductor memory device according to claim 1,
   wherein the memory cell is EEPROM.

13. The semiconductor memory device according to claim 1, wherein the memory cell unit is a NAND cell type EEPROM.

14. A semiconductor memory device comprising:
   a plurality of memory cell arrays having a plurality of memory cells or memory cell units each of which includes a plurality of memory cells, arranged in a matrix, the plurality of memory cell arrays being located independently of each other;
   a first memory cell array included in the plurality of memory cell arrays;
   a second memory cell array included in the plurality of memory cell arrays;
   a third memory cell array included in the plurality of memory cell arrays;
   a fourth memory cell array included in the plurality of memory cell arrays;
   a first memory cell array group including the first memory cell array and the second memory cell array; and
   a second memory cell array group including the third memory cell array and the fourth memory cell array,
   wherein the first memory cell array, the second memory cell array, the third memory cell array and the fourth memory cell array are different from one another, and first Pass/Fail signals, each of which indicates success or failure of an operation of a respective one of the first memory cell array group and the second memory cell array group, are outputted.

15. The semiconductor memory device according to claim 14, wherein the operation includes a parallel operation with respect to both of memory cells in the first memory cell array group and memory cells in the second memory cell array group.

16. The semiconductor memory device according to claim 14, wherein the operation includes a parallel operation with respect to memory cells in two or more of the plurality of memory cell arrays.

17. The semiconductor memory device according to claim 14, wherein the operation is a program or erase operation.

18. The semiconductor memory device according to claim 14, wherein the first Pass/Fail signal is a Pass/Fail signal indicating whether the operation has attained success with respect to all of selected memory cells included in each of the first memory cell array group and the second memory cell array group or not.

19. The semiconductor memory device according to claim 14, wherein a second Pass/Fail signal of an entire chip is also outputted when the first Pass/Fail signal is outputted.

20. The semiconductor memory device according to claim 14, wherein the first Pass/Fail signal is a Pass/Fail signal indicating whether the operation has attained success with respect to one memory cell array selected from the two or more memory cell arrays in each of the first memory cell array group and the second memory cell array group.

21. The semiconductor memory device according to claim 14, wherein the memory cell unit is a NAND cell type EEPROM.

\* \* \* \* \*